(12) United States Patent
Rasmussen

(10) Patent No.: US 7,724,044 B1
(45) Date of Patent: May 25, 2010

(54) DIGITAL MULTIPLEXOR WITH MULTIPLE SWITCHING MODES

(75) Inventor: Richard R. Rasmussen, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 112 days.

(21) Appl. No.: 12/178,342

(22) Filed: Jul. 23, 2008

Related U.S. Application Data

(60) Provisional application No. 61/074,052, filed on Jun. 19, 2008.

(51) Int. Cl.
*H03K 17/00* (2006.01)
*G06F 1/08* (2006.01)

(52) U.S. Cl. .......................... 327/99; 327/34; 327/298; 327/299

(58) Field of Classification Search .................. 327/34, 327/99, 298, 299
See application file for complete search history.

(56) References Cited

U.S. PATENT DOCUMENTS

| | | | |
|---|---|---|---|
| 4,623,223 | A | 11/1986 | Kempf |
| 4,853,653 | A | 8/1989 | Maher |
| 5,231,636 | A | 7/1993 | Rasmussen |

*Primary Examiner*—Lincoln Donovan
*Assistant Examiner*—John W Poos
(74) *Attorney, Agent, or Firm*—Vedder Price P.C.

(57) ABSTRACT

A digital signal multiplexor and multiplexing method are provided with which switching between different input signals is achieved without producing glitches in the output signal, even in the event of one or more of the input signals stopping and starting at unknown times.

23 Claims, 19 Drawing Sheets

FIG. 1

| | reset | clkin_mode1 | clkin_mode0 | clkin1_los | clkin0_los | current_clk | s1 | s0 | MUX Selection Change? |
|---|---|---|---|---|---|---|---|---|---|
| Force Clkin0 (Mode 0) | x | 0 | 0 | x | x | 0 | 0 | 1 | NO |
| | x | 0 | 0 | x | x | 1 | 0 | 1 | YES |
| Force Clkin1 (Mode 1) | x | 0 | 1 | x | x | 0 | 1 | 0 | YES |
| | x | 0 | 1 | x | x | 1 | 1 | 0 | NO |
| Non-Revertive Auto Select (Mode 2) | 1 | 1 | 0 | x | x | x | 0 | 1 | NO |
| | 0 | 1 | 0 | 0 | 0 | 0 | 0 | 1 | NO |
| | 0 | 1 | 0 | 0 | 0 | 1 | 1 | 0 | NO |
| | 0 | 1 | 0 | 1 | 0 | 0 | 0 | 1 | NO |
| | 0 | 1 | 0 | 1 | 0 | 1 | 0 | 1 | YES |
| | 0 | 1 | 0 | 0 | 1 | 0 | 1 | 0 | YES |
| | 0 | 1 | 0 | 0 | 1 | 1 | 1 | 0 | NO |
| | 0 | 1 | 0 | x | x | 0 | 0 | 1 | NO |
| | 0 | 1 | 0 | x | x | 1 | 1 | 0 | NO |
| Revertive Auto Select (Mode 3) | 1 | 1 | 1 | x | x | x | 0 | 1 | NO |
| | 0 | 1 | 1 | 0 | 0 | 0 | 0 | 1 | NO |
| | 0 | 1 | 1 | 0 | 0 | 1 | 0 | 1 | YES |
| | 0 | 1 | 1 | 1 | 0 | 0 | 0 | 1 | YES |
| | 0 | 1 | 1 | 1 | 0 | 1 | 0 | 1 | YES |
| | 0 | 1 | 1 | 0 | 1 | 0 | 1 | 0 | NO |
| | 0 | 1 | 1 | x | x | 1 | 0 | 1 | NO |

| los_time1 | los_time0 | Frequency Threshold (typ) | Timeout Threshold (typ) |
|---|---|---|---|
| 0 | 0 | 500 KHz | 2us |
| 0 | 1 | 2.5 MHz | 400ns |
| 1 | 0 | 10 MHz | 100ns |
| 1 | 1 | 25 MHz | 40ns |

| | reset | clkin_mode<2:0> | clkin1_los | clkin0_los | current_clk | s1 | s0 | MUX Selection Change? |
|---|---|---|---|---|---|---|---|---|
| Force Clkin0 (Mode 0) | x | 000 | x | x | 0 | 0 | 1 | NO |
| | x | 000 | x | x | 1 | 0 | 1 | YES |
| Force Clkin1 (Mode 1) | x | 001 | x | x | 0 | 1 | 0 | YES |
| | x | 001 | x | x | 1 | 1 | 0 | NO |
| Non-Revertive Auto Select (Mode 2) | 1 | 010 | x | x | x | 0 | 1 | NO |
| | 0 | 010 | 0 | 0 | 0 | 0 | 1 | NO |
| | 0 | 010 | 0 | 0 | 1 | 1 | 0 | NO |
| | 0 | 010 | 0 | 1 | 0 | 0 | 1 | NO |
| | 0 | 010 | 1 | 0 | 1 | 1 | 0 | NO |
| | 0 | 010 | 1 | 0 | 0 | 1 | 0 | YES |
| | 0 | 010 | 0 | 1 | 1 | 0 | 1 | YES |
| clkin0 default | 0 | 010 | 0 | 0 | 0 | 0 | 1 | NO |
| | 0 | 010 | 1 | 0 | 0 | 1 | 0 | YES |
| | 0 | 010 | x | x | 1 | 1 | 0 | NO |
| Revertive Auto Select (Mode 3) | 1 | 011 | x | x | x | 0 | 1 | NO |
| | 0 | 011 | 0 | 0 | 0 | 0 | 1 | NO |
| | 0 | 011 | 0 | 0 | 1 | 0 | 1 | YES |
| | 0 | 011 | 1 | 0 | 0 | 1 | 0 | NO |
| | 0 | 011 | 0 | 1 | 1 | 0 | 1 | YES |
| | 0 | 011 | 1 | 0 | 1 | 1 | 0 | YES |
| clkin0 default | 0 | 011 | 0 | 1 | 0 | 1 | 0 | NO |
| | 1 | 011 | x | x | 0 | 0 | 1 | NO |
| | 0 | 011 | x | x | 1 | 1 | 0 | NO |

FIG. 12A

| | reset | clkin_mode<2:0> | clkin1_los | clkin0_los | current_clk | s1 | s0 | MUX Selection Change? |
|---|---|---|---|---|---|---|---|---|
| 1 → | 2 → | 3,4 → | 5 → | 6 → | 7 → | 8 → | 9 → | 10 → |
| Non-Revertive Auto Select (Mode 4) clkin1 default | 1 | 100 | x | x | x | 1 | 0 | NO |
| | 0 | 100 | 0 | 0 | 0 | 0 | 1 | NO |
| | 0 | 100 | 0 | 0 | 1 | 1 | 0 | NO |
| | 0 | 100 | 0 | 1 | 0 | 1 | 0 | NO |
| | 0 | 100 | 1 | 0 | 1 | 0 | 1 | YES |
| | 0 | 100 | 0 | 1 | 0 | 1 | 0 | YES |
| | 0 | 100 | 0 | 1 | 1 | 1 | 0 | NO |
| | 0 | 100 | x | x | 1 | 1 | 0 | NO |
| Revertive Auto Select (Mode 5) clkin1 default | 1 | 101 | x | x | x | 1 | 0 | NO |
| | 0 | 101 | 0 | 0 | 0 | 0 | 1 | NO |
| | 0 | 101 | 0 | 0 | 1 | 0 | 1 | YES |
| | 0 | 101 | 1 | 0 | 0 | 0 | 1 | NO |
| | 0 | 101 | 1 | 0 | 1 | 0 | 1 | YES |
| | 0 | 101 | 0 | 1 | 0 | 1 | 0 | YES |
| | 0 | 101 | 0 | 1 | 1 | 1 | 0 | NO |
| | 0 | 101 | x | x | 1 | 1 | 0 | NO |

FIG. 12B

DIGITAL MULTIPLEXOR WITH MULTIPLE SWITCHING MODES

RELATED APPLICATION DATA

This application is a nonprovisional application based on U.S. Provisional Application No. 61/074,052, filed Jun. 19, 2008.

BACKGROUND

1. Field of Invention

The present invention relates to signal multiplexors, in a particular, to digital signal multiplexors.

2. Related Art Paragraph

Signal multiplexors are well known in the art, and are generally used to perform signal switching or routing functions. Generally, when multiplexing analog signals, relative timing between the input switching and a particular point on the waveform of the analog signal being selected is of little concern or consequence. However, when multiplexing digital signals, such timing can be critical. For example, if the signals being multiplexed are periodic, i.e., with periodic asserted and de-asserted states, such relative timing can result in the output signal having a signal state (asserted or de-asserted) which is truncated prematurely. For example, when switching between two clock signals, if it is desirable to maintain output clock signal pulses having consistent or constant pulse durations, relative timing of the switching can be critical and difficult to maintain correctly. Such premature or otherwise undesirable truncation of output signal pulses are often referred to as "glitches", and are generally undesirable, and often problematic.

SUMMARY

A digital signal multiplexor and multiplexing method are provided with which switching between different input signals is achieved without producing glitches in the output signal, even in the event of one or more of the input signals stopping and starting at unknown times.

In accordance with one embodiment of the presently claimed invention, a digital multiplexor for selecting among a plurality of input clock signals to provide an output clock signal substantially free of spurious signals related to the selecting among the plurality of input clock signals includes:

signal loss detection circuitry responsive to a plurality of input clock signals by providing a plurality of signal loss status signals and a plurality of system control signals, wherein each one of the plurality of input clock signals includes respective active and inactive signal states, and respective pulse durations during the active signal states;

decoding circuitry coupled to the signal loss detection circuitry and responsive to the plurality of system control signals and a plurality of clock mode control signals by providing a plurality of clock state signals and an output reset signal; and synchronized multiplexor circuitry coupled to the decoding circuitry and responsive to the plurality of input clock signals, the plurality of clock state signals and the output reset signal by selecting one of the plurality of input clock signals as an output clock signal having a minimum pulse duration at least as long as one of the respective pulse durations of the plurality of input clock signals, wherein a first one of the plurality of input clock signals is initially selected as the output clock signal, following a transition by the first one of the plurality of input clock signals from the active state to the inactive state, the first one of the plurality of input clock signals is deselected as the output clock signal, following the deselection of the first one of the plurality of input clock signals as the output clock signal, the output clock signal is reset to a predetermined state, and following the resetting of the output clock signal to the predetermined state, a second one of the plurality of input clock signals is selected as the output clock signal.

In accordance with another embodiment of the presently claimed invention, a digital multiplexor for selecting among a plurality of input clock signals to provide an output clock signal substantially free of spurious signals related to the selecting among the plurality of input clock signals includes:

detector means for receiving a plurality of input clock signals including first and second clock signals having, when active, first and second clock pulse durations, respectively, and in response thereto providing a plurality of decoder control signals;

decoder means for receiving a plurality of selection control signals and the plurality of decoder control signals, and in response thereto providing a plurality of multiplex control signals;

multiplexor means for receiving the plurality of input clock signals and the plurality of multiplex control signals, and in response thereto during a first selection time interval, selecting the first clock signal for use as an output signal, during a first intervening time interval following the plurality of multiplex control signals becoming indicative of a detection of the first clock signal having become inactive, deselecting the first clock signal for use as the output signal, during the first intervening time interval, resetting the output signal to a predetermined state unrelated to the first and second clock signals, and following the resetting of the output signal to a predetermined state, during a second selection time interval, selecting the second clock signal for use as the output signal, wherein the output signal has a minimum pulse duration at least as long as one of the first and second clock pulse durations during the first and second selection time intervals.

In accordance with another embodiment of the presently claimed invention, a method for selecting among a plurality of input clock signals to provide an output clock signal substantially free of spurious signals related to the selecting among the plurality of input clock signals includes:

receiving a plurality of input clock signals including first and second clock signals having, when active, first and second clock pulse durations, respectively;

receiving a plurality of selection control signals and in response thereto, during a first selection time interval, selecting the first clock signal for use as an output signal;

detecting when the first clock signal becomes inactive and in response thereto, during a first intervening time interval, deselecting the first clock signal for use as the output signal;

during the first intervening time interval, resetting the output signal to a predetermined state unrelated to the first and second clock signals; and following the resetting of the output signal to a predetermined state, during a second selection time interval, selecting the second clock signal for use as the output signal, wherein the output signal has a minimum pulse duration at least as long as one of the first and second clock pulse durations during the first and second selection time intervals.

BRIEF DESCRIPTION OF THE DRAWINGS

FIG. 1 is a truth table describing a digital signal multiplexor in accordance with one embodiment of the presently claimed invention.

FIGS. 12A-12B are a truth table for a digital signal multiplexor in accordance with another exemplary embodiment of the presently claimed invention.

DETAILED DESCRIPTION

Figure 2:
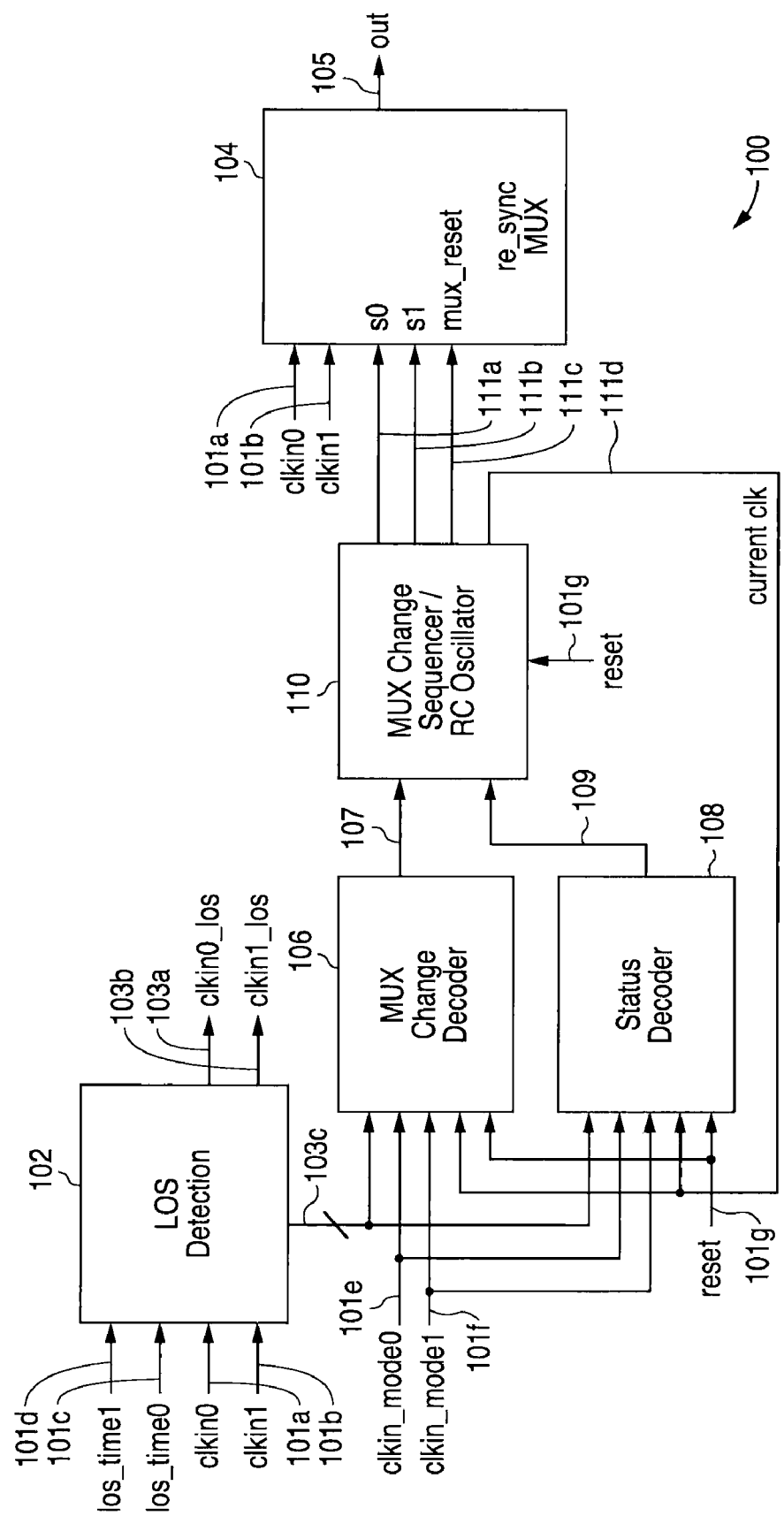
FIG. 2 is a functional block diagram of a digital signal multiplexor in accordance with one embodiment of the presently claimed invention.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

A digital signal multiplexor in accordance with the presently claimed invention can switch among different input signals without producing glitches in the output signal, regardless of the input signal states. In accordance with one embodiment of the presently claimed invention, four different selection modes are provided: two forced select modes, and two auto-select modes.

A digital signal multiplexor in accordance with the presently claimed invention is particularly advantageous in analog-to-digital converters (ADCs), digital-to-analog converters (DACs) and digital communication circuits. As discussed in more detail below, a digital signal multiplexor in accordance with the presently claimed invention includes energy detection circuitry, and internal state machine with a separate asynchronous clock signal, and a multiplexor control state machine which prevents glitches from being produced in the output signal.

Referring to FIG. 1, this truth table illustrates operation of a two-input multiplexor in accordance with one embodiment of the presently claimed invention. Such a multiplexor selects one of its clock input based on the status of its input clocks in conjunction with the status of mode control inputs (as will be evident to one of ordinary skill in the art from the discussion below, this technique can be extended to include additional input clocks as well).

As indicated in column 1, one of four modes of operation are selected by a 2-bit control input (columns 3 and 4): (1) force select of clock 0, where clock 0 is selected always regardless of clock activity; (2) force select of clock 1, where clock 1 is always selected regardless of clock activity; (3) non-revertive auto-select mode, where clock 1 is selected if clock 0 stops and clock 0 is re-selected if it re-starts and clock 1 stops; and (4) revertive auto-select mode, where clock 1 is selected if clock 0 stops and clock 0 is re-selected if it re-starts.

Column 2 identifies occurrences of the reset, columns 3 and 4 identify states of the clock mode select signals, columns 5 and 6 identify states of the signals indicating when the input clock signals have been lost, column 7 identifies which input clock is the current clock, columns 8 and 9 identify two sequence control signals (discussed below), and column 10 identifies whether a signal selection change has occurred. (A "0" and a "1", depending upon the signal, indicates either a de-asserted or inactive signal state, or an asserted or active signal state, respectively, and an "x" indicates a "do not care" condition, i.e., where the state of the corresponding signal is irrelevant.)

When the multiplexor switches from one clock input to the other clock input, no glitches appear in the output signal, i.e., the output signal will not include an output pulse which is more narrow than the pulse width of the previously selected clock signal or the newly selected clock signal, whichever is smaller. The reset is provided to force the circuit into a known condition.

Referring to FIG. 2, a multiplexor 100 in accordance with one embodiment of the presently claimed invention includes a loss-of-signal detection stage 102, a re-synch (re-synchronization) multiplexor stage 104, a change decoder 106, a status decoder 108, and a change sequencer and RC (resistive-capacitive) oscillator stage 110, interconnected substantially as shown. The loss-of-signal detection stage 102 receives input clock signals 101a, 101b and loss-of-signal timing control signals 101c, 101d, and provides output signals 103a, 103b indicating when the input clock signals 101a, 101b are lost, and multiple additional control signals 103c for the change decoder 106 and status decoder 108.

The change decoder 106 and status decoder 108 also receive clock mode select signals 101e, 101f, and a reset signal 101g. The change decoder 106 provides a signal 107 and the status decoder 108 provides a signal 109 to the change sequencer and RC oscillator 110, which also receives the reset signal 101g. The change sequencer and RC oscillator 110 provides state signals 111a, 111b and a reset signal 111c to the re-synch multiplexor 104, which also receives the input clock signals 101a, 101b. The change sequencer and RC oscillator 110 also provides a feedback clock signal 111d to the change decoder 106 and status decoder 108. The re-synch multiplexor provides the output signal 105, which is the glitch-free output signal corresponding to the selected input clock signal 101a, 101b.

The change decoder 106 includes combinational logic circuitry that provides, as its output signal 107, a logic 1 signal when conditions indicate that the multiplexor must be switched between input clock signals. The status decoder 108 provides, as its output signal 109, the appropriate logic 1 or 0 signal, which causes the sequencer 110 to begin switching the operation of the re-synch multiplexor 104, in coordination with the state signals 111a, 111b and reset signal 111c (discussed in more detail below). The sequencer 110 is internally clocked by the RC oscillator which is a free running internal oscillator that is active only during the transition of the re-synch multiplexor, i.e., as the output signal 105 transitions from corresponding to one of the input clock signals to the other input clock signal. The change decoder 106 tells when a clock transition is necessary, while the status decoder 108 tells which clock becomes the selected clock. Hence, the change decoder 106 prevents unnecessary operation of the sequencer 110 which may otherwise occur each time a change in loss-of-signal conditions occurs, even if the multiplexor 100 would not change in its clock selection, thereby unnecessarily introducing a delay, and, therefore, an undesirable timing anomaly, into the output signal 105 while the sequencer 110 completed its selection of the same input clock signal as previously selected.

Figures 3, 4:
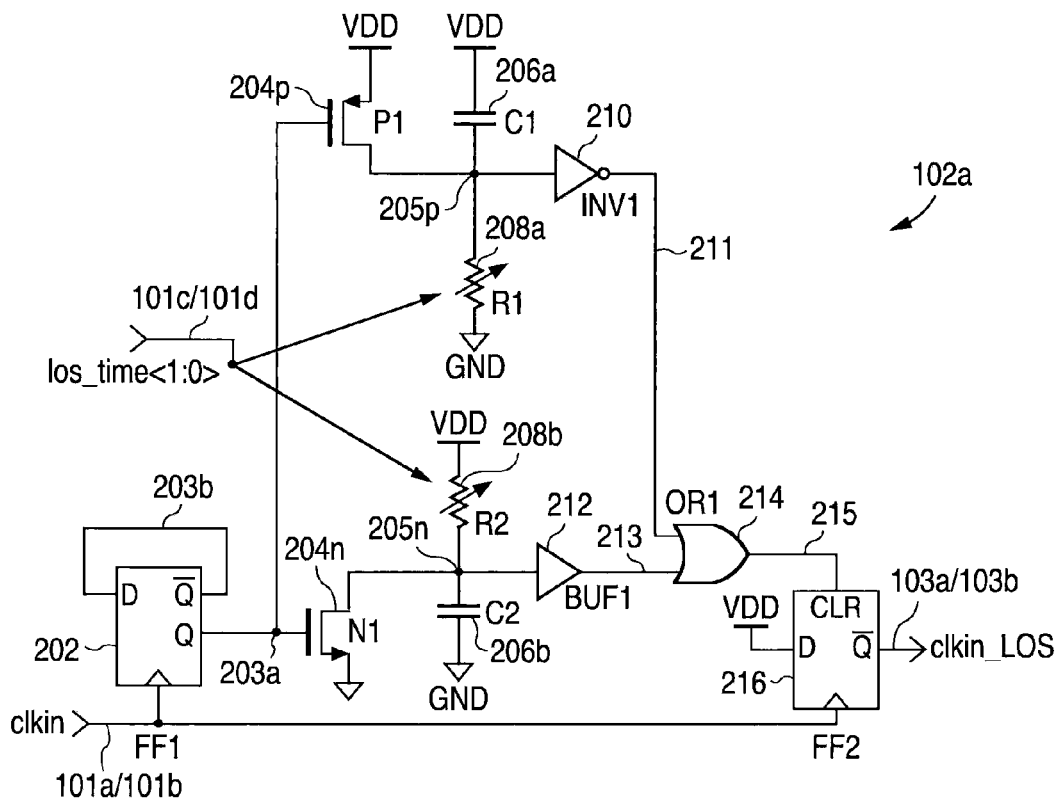
FIG. 3 is schematic diagram of an exemplary embodiment of a portion of the loss-of-signal detection stage of FIG. 2.
FIG. 4 is a table identifying exemplary frequency and timeout thresholds for the circuit of FIG. 3.

Refrain to FIG. 3, a loss-of-signal timeout detector 102a is included in the loss-of-signal detection stage 102 for each of the input clock signals 101a, 101b. This circuit 102a includes D-type-flips-flops 202, 216, MOS (metal oxide semiconductor) transistors 204p, 204n, capacitances 206a, 206b, programmable resistances 208a, 208b, an inverter 210, a buffer 212 and a logic NOR Gate 214, all interconnected substantially as shown. The input clock signal 101a/101b is divided in half (in frequency) by the first flip-flop 202 so that the circuit 102a detects frequency independent of duty cycle. So long as the frequency of the input clock signal 101a/104b is sufficiently high, the frequency-divided signal 203a pulses the gates of the transistors 204p, 204n sufficiently often to maintain the capacitances 206a, 206b in sufficiently discharged states, i.e., with node 205p maintained at approximately the power supply voltage VDD, and node 205n maintained at approximately circuit ground potential GND. In the absence of an input clock signal 101a, 101b, the transmitters 204p, 204n are no longer switched on, thereby allowing one of the capacitances 206a, 206b to charge, thereby pushing node 205p toward circuit ground potential GND or node 205n toward the power supply voltage VDD. This, in turn, causes one of the input signals 211, 213 to the logic NOR gate 214 to achieve a logic 1 state, thereby producing a logic 1 signal 215 that clears the output-flip-flop 216. This results in the loss-of-signal indicator signal 103a/103b to become asserted.

Referring to FIG. 4, the control signals 101c, 101d, which program the resistances 208a, 208b (FIG. 3), determine the timeout threshold for how soon the loss-of-signal alarm signal 103a/103b is asserted. As should be recognized, these timeout thresholds correspond to minimum frequencies for the input clock signals 101a, 101b below which a loss-of-signal alarm condition arises. (These timeout thresholds and corresponding frequency thresholds are merely examples, and can be modified as desired by appropriate values for the capacitances 206a, 206b and programmable resistances 208a, 208b.)

Figure 5:
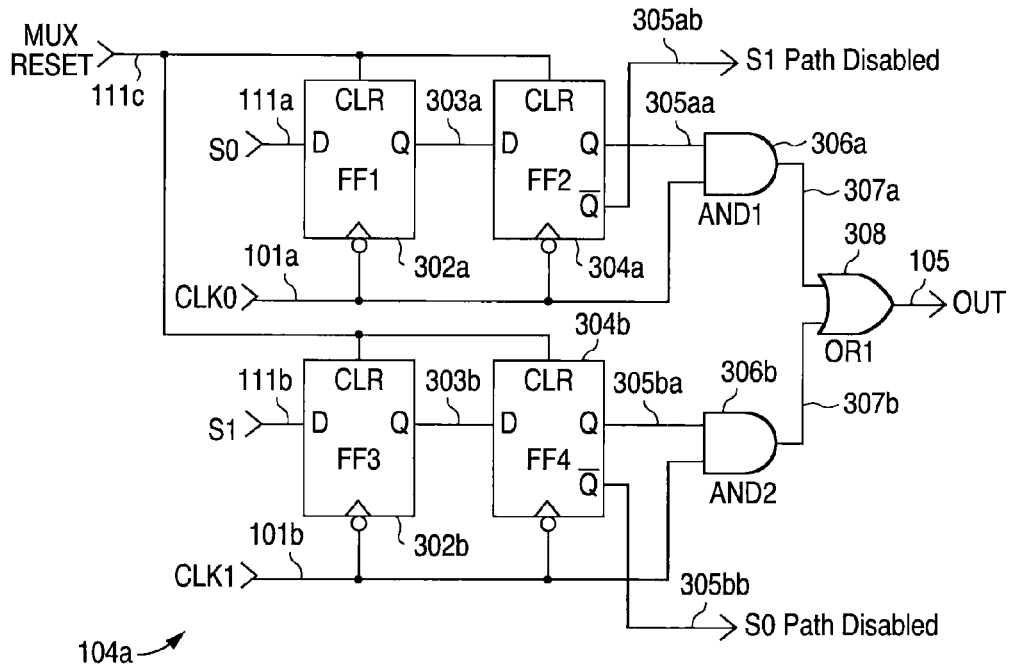
FIG. 5 is a logic diagram of an exemplary embodiment of the re-sync multiplexor stage of FIG. 2.

Referring to FIG. 5, one example embodiment 104a of the re-synch multiplexor 104 includes D-type flip-flops 302a, 302b, 304a, 304b, logic AND gates 306a, 306b, and a logic OR gate 308, all interconnected substantially as shown. The reset signal 111c from the sequencer 110 (FIG. 2) clears the flip-flops 302a, 302b, 304a, 304b, which otherwise capture the state signals 111a, 111b in accordance with the input clock signals 101a, 101b. The final captured signals 305aa, 305ba enable or disable, via the logic AND gates 306a, 306b, the use of one of the input clock signals 101a, 101b, via the logic OR gate 308, as the selected output clock signal 105. Status signals 305ab, 305bb are provided such that each status signal 305ab, 305bb indicates when the signal path for the other clock has been disabled, i.e., when the other clock signal 101a, 101b has not been selected for use as the output clock signal 105.

Figure 6:
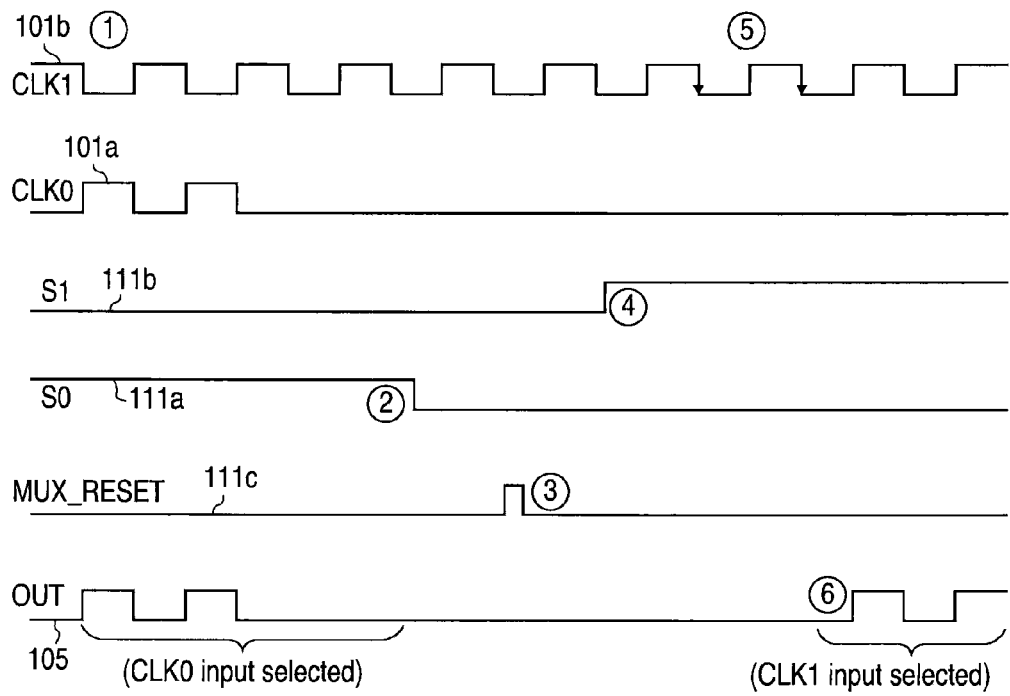
FIG. 6 is a signal timing diagram for operation of the circuit of FIG. 5 in accordance with an exemplary embodiment of the presently claimed invention.

Referring to FIG. 6, operation of the circuit 104a of FIG. 5 can be better understood. During time interval 1, the first input clock 101a is currently selected to be provided as the output signal 105. Soon thereafter, this clock signal 101a stops, and the loss-of-signal alarm signal 103a (FIG. 3) is asserted. This sets into motion the operation of the state machine within the sequencer 110, which is clocked by an independent oscillator that is enabled for a few clock cycles, i.e., until the transition between the multiplexor input signals has been successfully completed, following which this oscillator disables itself. As a result, the sequencer 110 provides the state signals 111a, 111b and reset signal 111c, as shown.

At time 2, the first state signal 111a transitions to a logic 0 to de-select the first input clock signal 101a. At time 3, the multiplexor reset signal 111c is pulsed to clear all flip-flops 302a, 302b, 304a, 304b within the re-sync multiplexor 104 (FIG. 5). This ensures that no logic 1 signal states are "orphaned", i.e., left remaining, as enabled clock signals 307a, 307b, which might produce a logic contention within the output logic OR gate 308. At time 4, the other state signal 111b transitions to a logic 1 to select the second input clock signal 101b. Following two successive negative clock signal edges of this selected clock signal 101b (during time interval 5), the output signal 105 begins following the second input clock signal 101b (at time 6).

Figure 7:
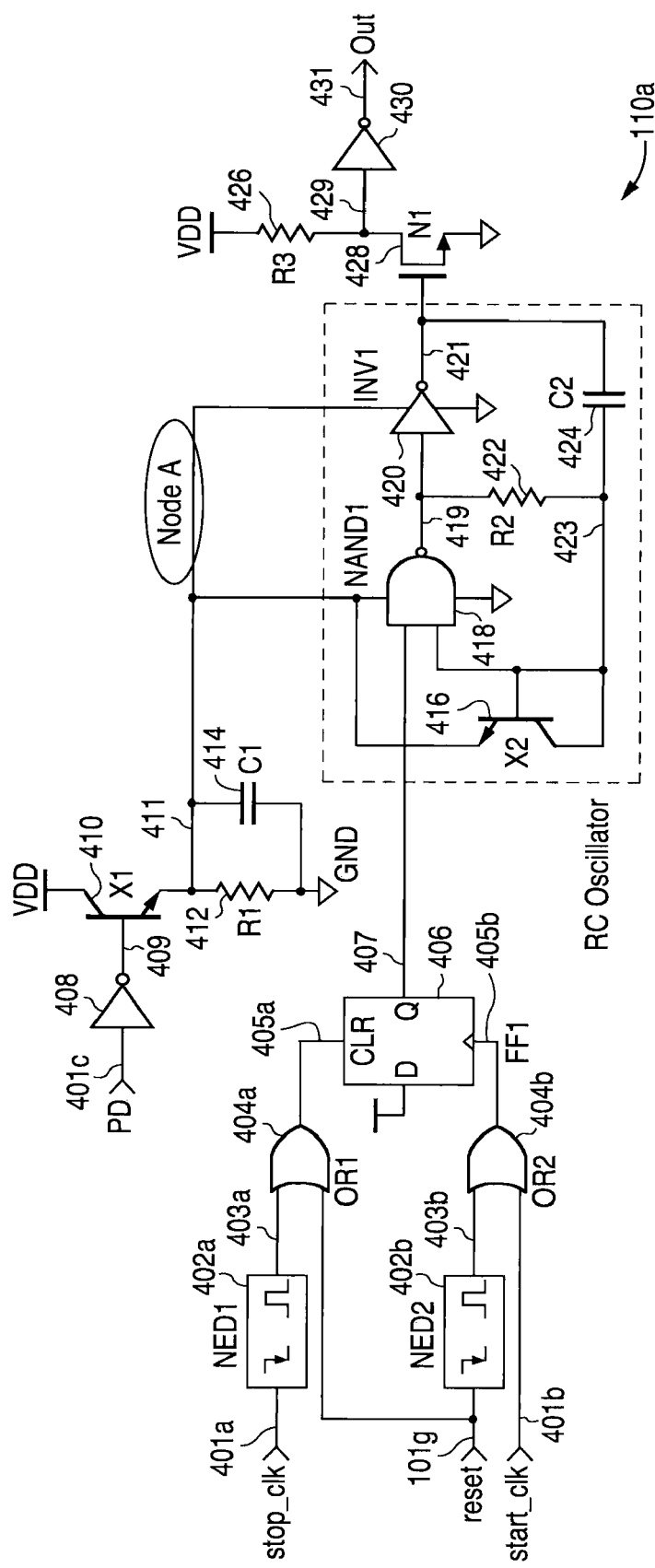
FIG. 7 is a logic and schematic diagram of an exemplary embodiment of the oscillator circuitry within the sequencer stage of FIG. 2.
Figure 8A:
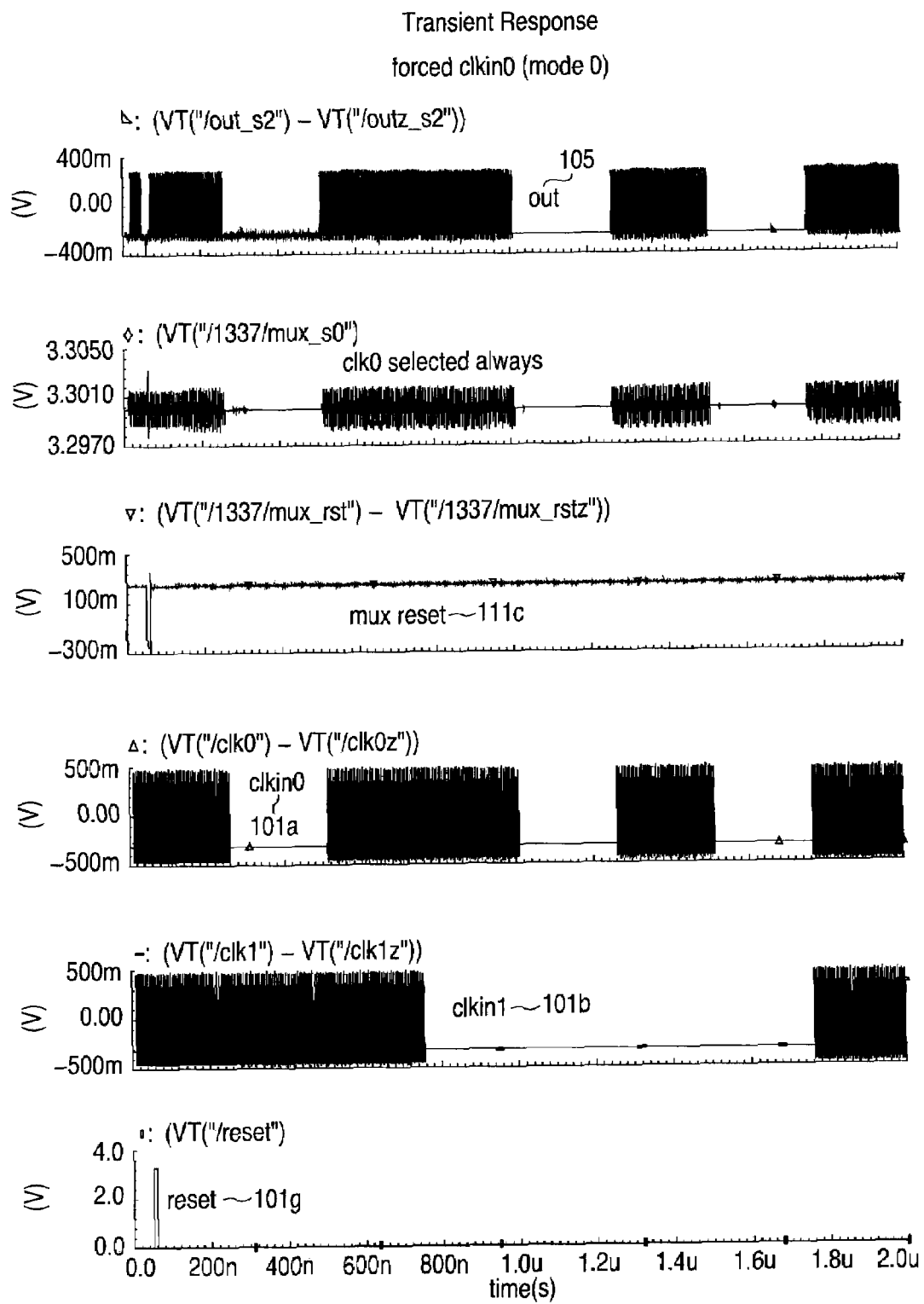
FIGS. 8A-8D are signal timing diagrams for input and output signals of FIG. 2 in accordance with the truth table of FIG. 1.
Figure 8B:
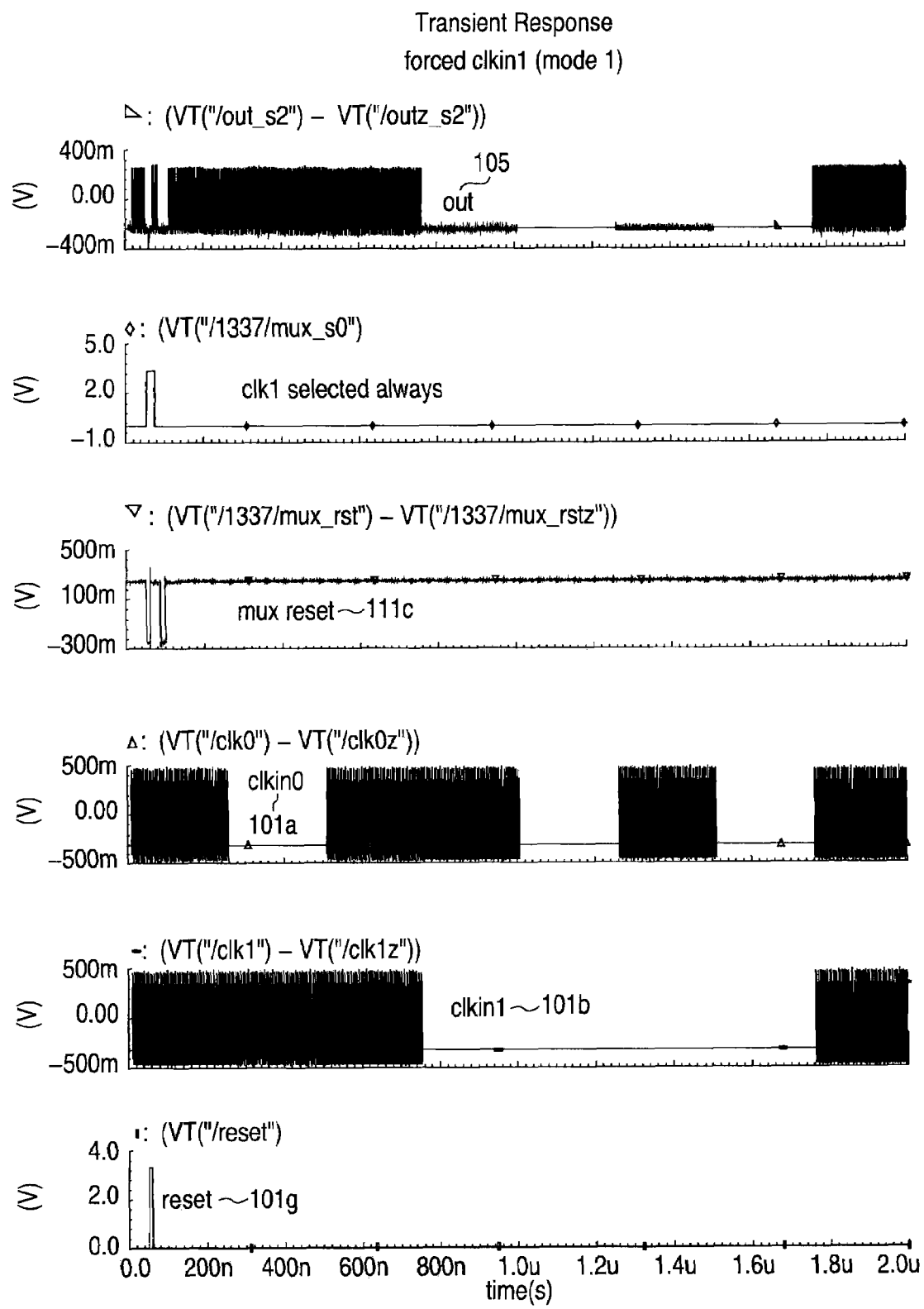
Figure 8C:
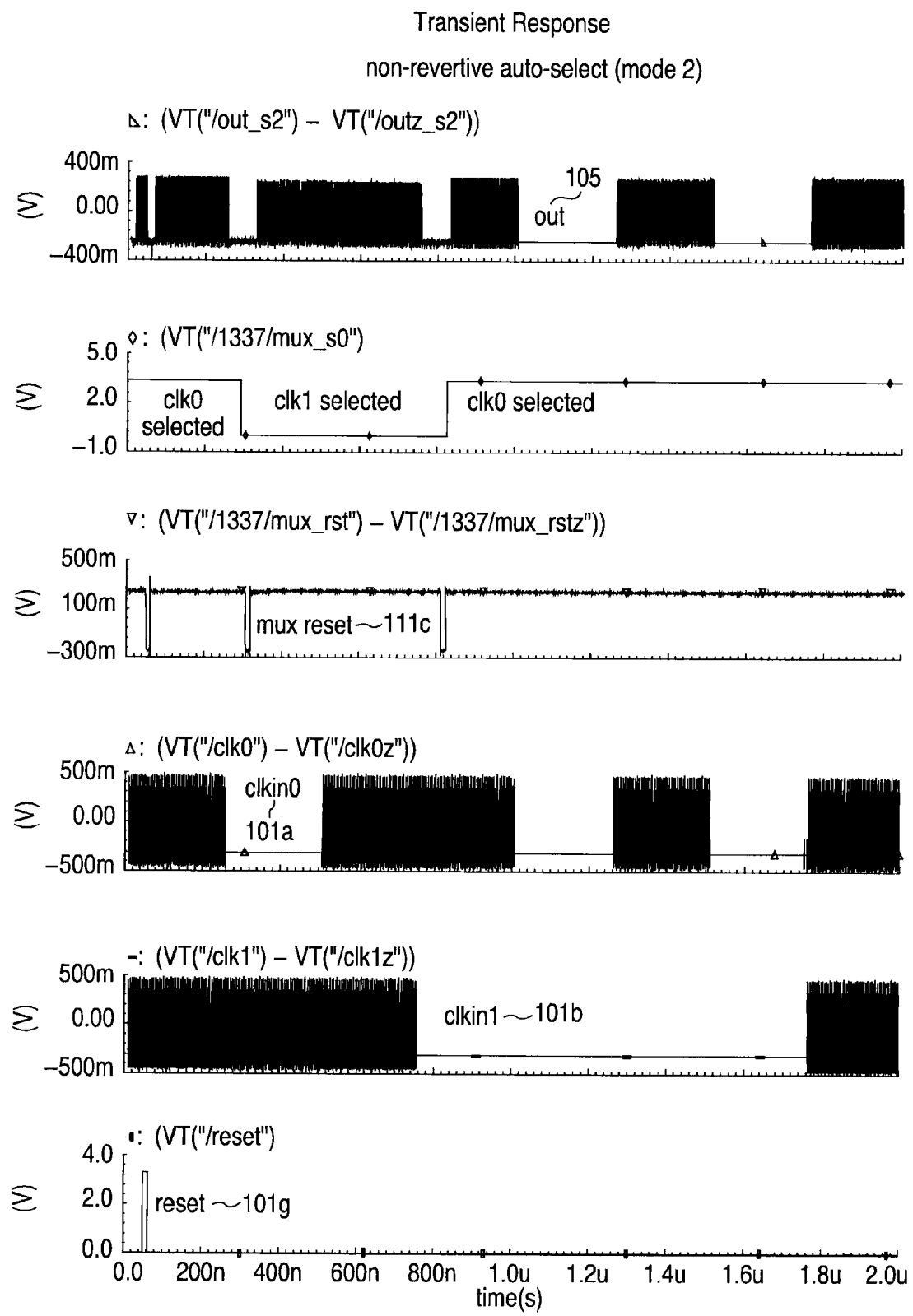
Figure 8D:
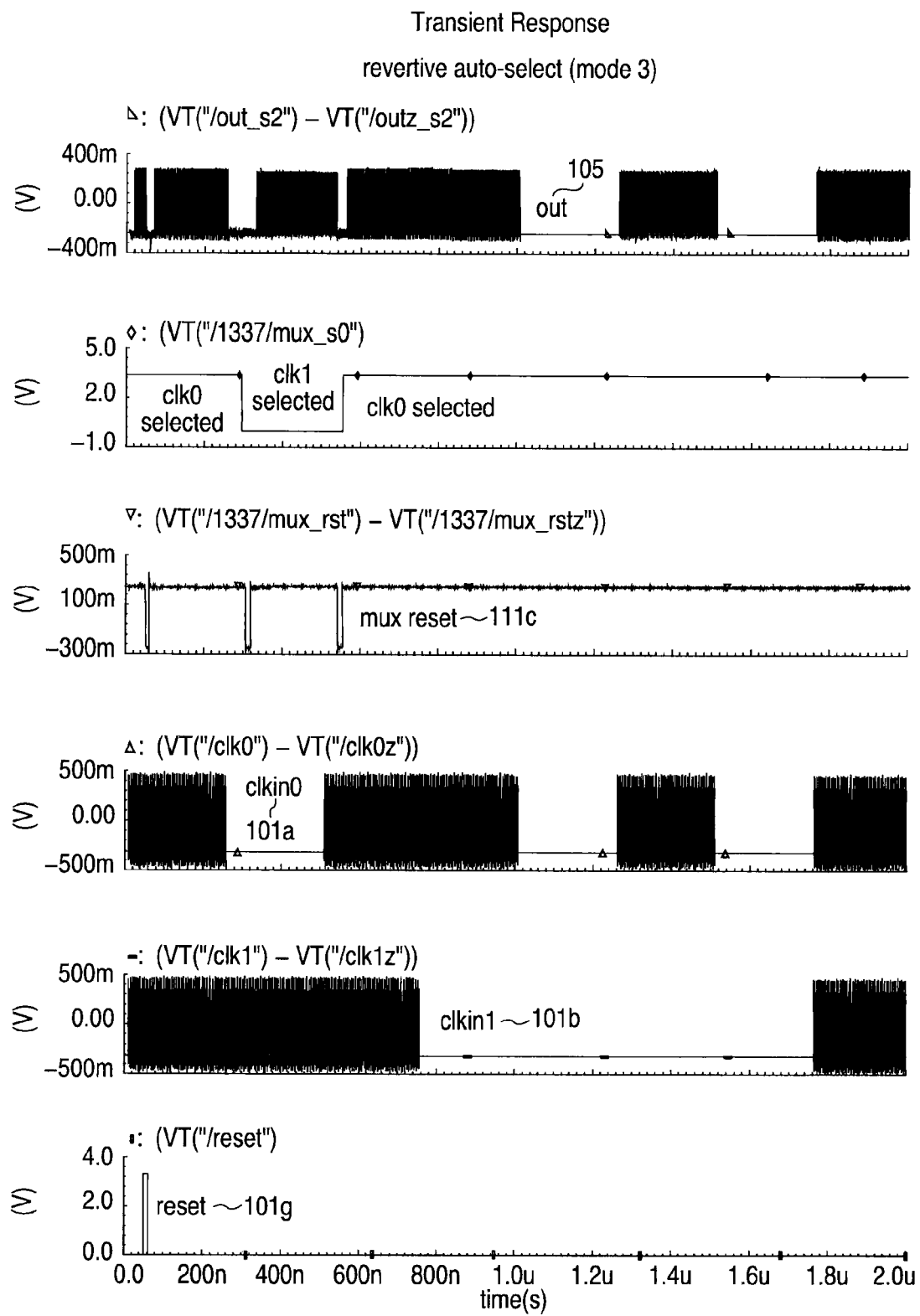

Referring to FIG. 7, one example embodiment 110a of the internal oscillator within the sequencer 110 (FIG. 2) can be implemented with negative edge detectors 402a, 402b, logic OR gates 404a 404b, a D-type flip-flop 406, an inverter 408, a bipolar junction transistor 410, a resistance 412, a capacitance 414, another transistor 416, a logic NAND gate 418, another inverter 420, another resistance 422, another capacitance 424, a MOS transistor 428, another resistance 426, and a buffer 430, all interconnected substantially as shown. A power down control signal 401c provides for enabling and disabling the oscillator supply voltage 411 via the transistor 410, which acts as a switch. This supply voltage 411 provides power for the components 416, 418, 420, 422, 424 forming the RC oscillator.

A start clock control signal 401b, via a logic OR gate 404b, sets the flip-flop 406, the output signal 407 of which enables the logic NAND gate 418, thereby starting operation of the RC oscillator. This signal 407 is asserted whenever the change decoder 106 (FIG. 2) asserts the start clock control signal 401b, or alternatively, following de-assertion of the reset signal 101g as detected by the negative edge detector 402b. Such de-assertion of the reset signal 101g, as detected by the negative edge detector 402b, allows this circuit 110a to be put into a known state, thereby providing some determinism, by clearing flip-flop 406.

A stop clock control signal, when de-asserted, triggers the other negative edge detector 402a, which generates a signal 403a that, via the logic OR gate 404a clears the flip-flop 406. The resulting the de-asserted output signal 407 disables the logic NAND gate 418, thereby stopping the RC oscillator operation. Assertion of the reset signal 101g will also clear the flip-flop 406 via the output signal 405a of the logic OR gate 404a.

When the flip-flop 406 is set, i.e., its output signal 407 asserted, the oscillator starts and runs freely at a frequency inversely proportional to the RC product (R2*C2) of the resistance 422 and the capacitance 424. The oscillator supply voltage 411 is provided by the emitter follower transistor 410. This reduced power supply voltage is used since normal operation of the RC oscillator will cause the capacitance 424 to capacitively drive the lower input of the logic NAND gate 418 above the oscillator supply voltage 411. Since this may cause break down problems with the devices within the logic NAND gate 418, the diode-connected transistor 416 acts as a voltage clamp to prevent this input node from rising significantly above the oscillator supply voltage 411.

Once the RC oscillator has provided four clock pulses via the output signal 431 for use elsewhere within the sequencer 110 (FIG. 2), the stop clock control signal 401a is generated elsewhere within the sequencer 110. As discussed above, this clears the flip-flop 406, thereby disabling the RC oscillator after one additional output signal 431 edge has been produced, following which the RC oscillator remains in a static state.

Referring to FIGS. 8A-8D, the signal timing diagrams for the output signal 105, multiplexor reset signal 111c, input clock signals 101a, 101b, and reset signal 101g can be seen for each of the four modes of operation.

Figure 9A:
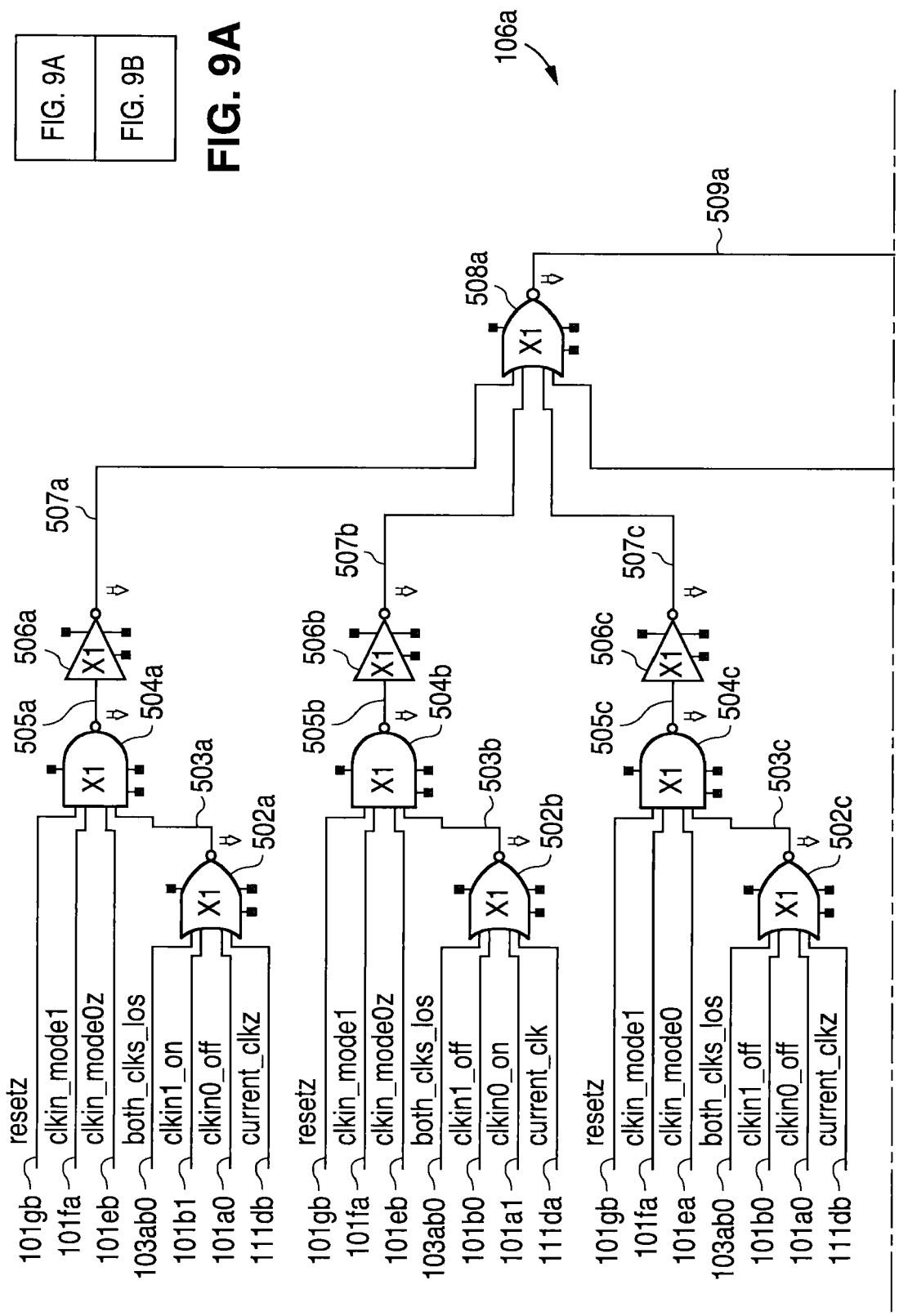
FIG. 9 is a logic diagram of an exemplary embodiment of the change decoder stage of FIG. 2.
Figure 9B:
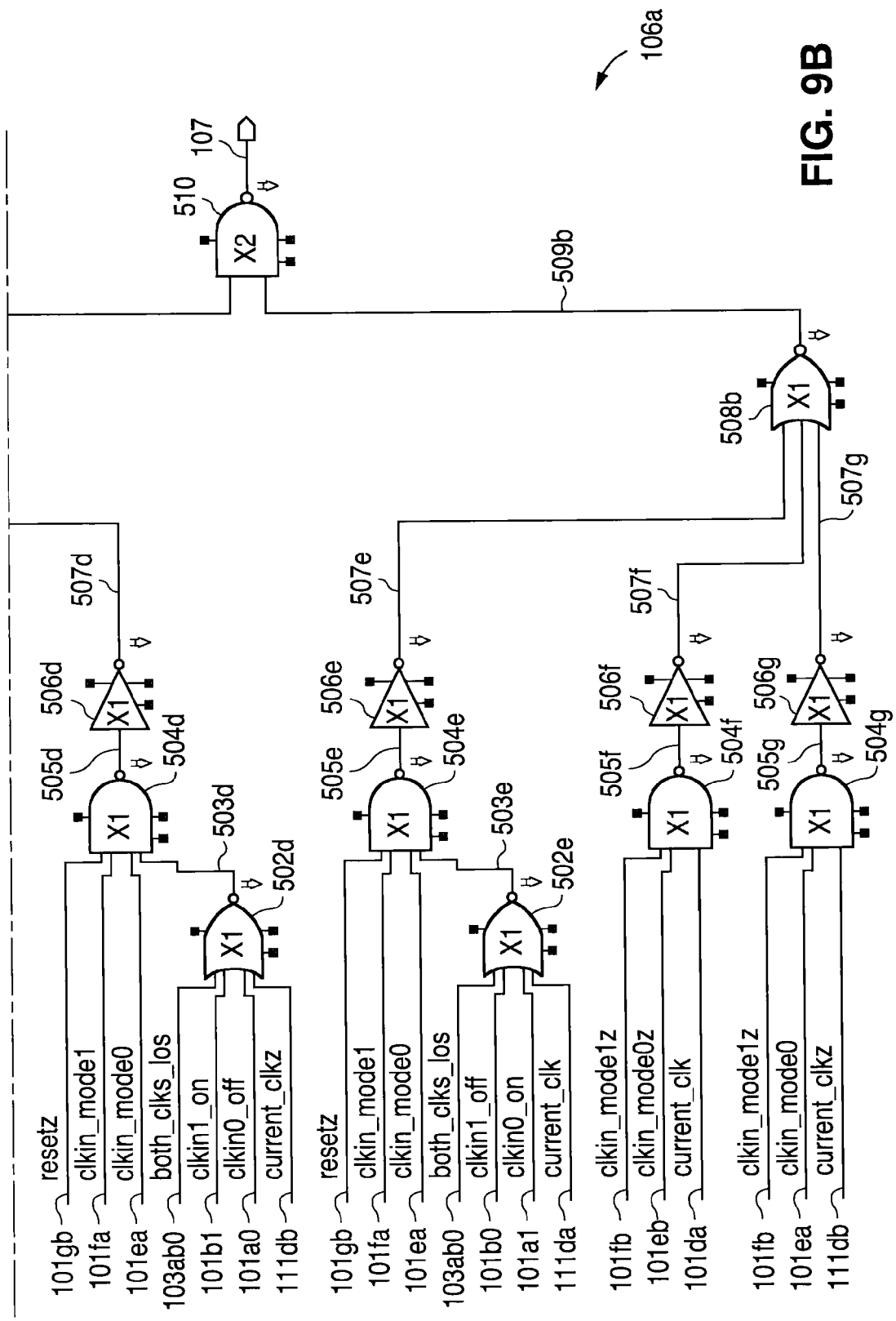

Referring to FIG. 9, one example embodiment 106a of the change decoder 106 (FIG. 2) can be implemented using logic NOR gates 502a, 502b, 502c, 502d, 502e, logic NAND gates 504a, 504b, 504c, 504d, 504e, 504f, 504g, logic inverters 506a, 506b, 506c, 506d, 506e, 506f, 506g, additional logic NOR gates 508a, 508b, and another logic NAND gate 510, all interconnected substantially as shown. The input signals (identified at the left side of this figure) are received from external sources, as members of the set of control signals 103c produced by the loss-of-signal detection stage 102, the clock mode select signals, the reset signal and the clock feedback signal 111d, as discussed above for FIG. 2. The same numeric designators as used in FIG. 2 are used here to identify corresponding signals, with an additional alpha suffix of "a" or "b" to identify non-inverted and inverted versions, respectively, of the signal, or with an additional numerical suffix of "0" or "1" to identify a signal indicating that the corresponding signal is off or on, respectively. One exception to this format is a signal 103ab0 identifying a status signal indicative of both clocks 101a, 101b being off or inactive.

Figure 10A:
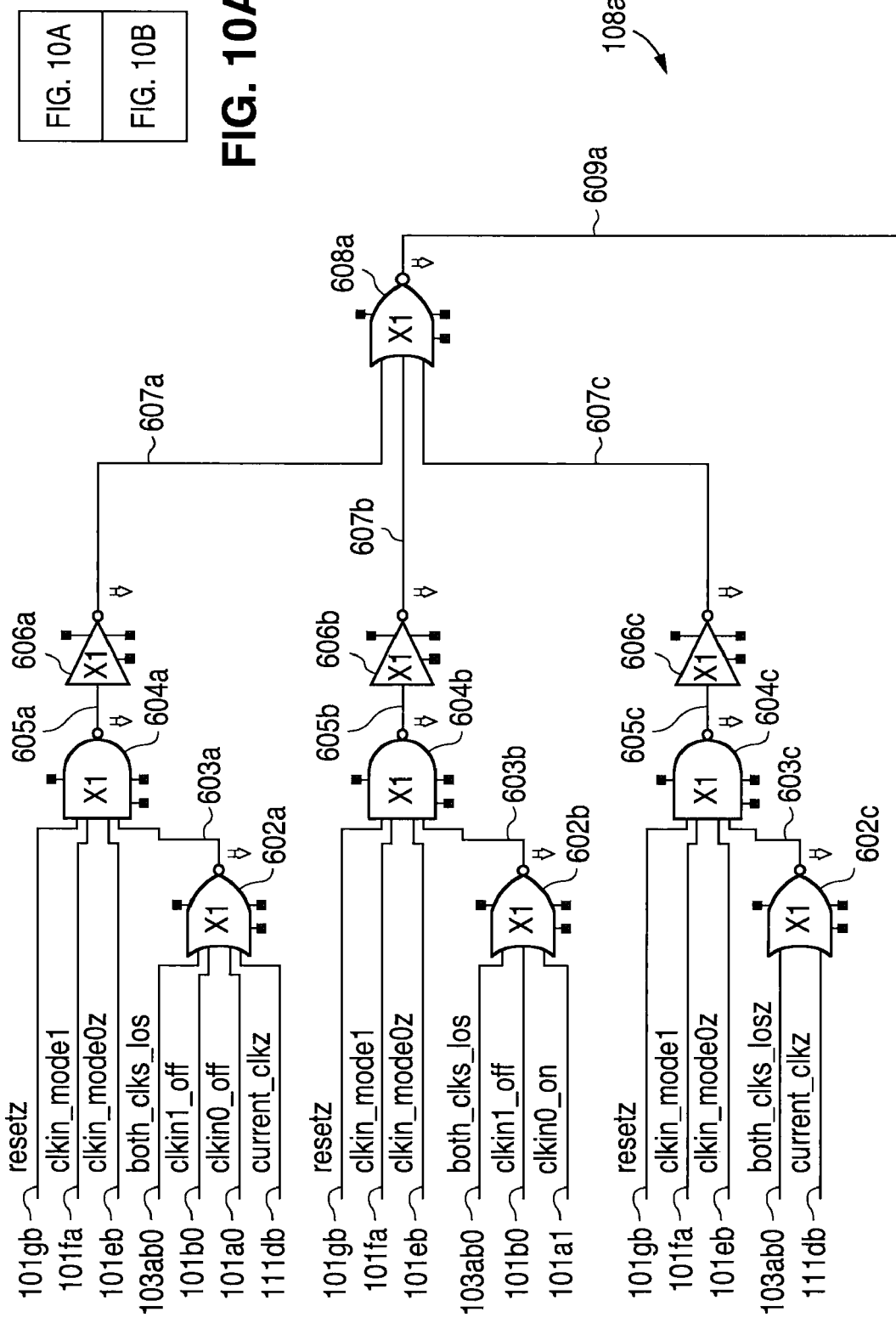
FIG. 10 is a logic diagram of an exemplary embodiment of the status decoder stage of FIG. 2.
Figure 10B:
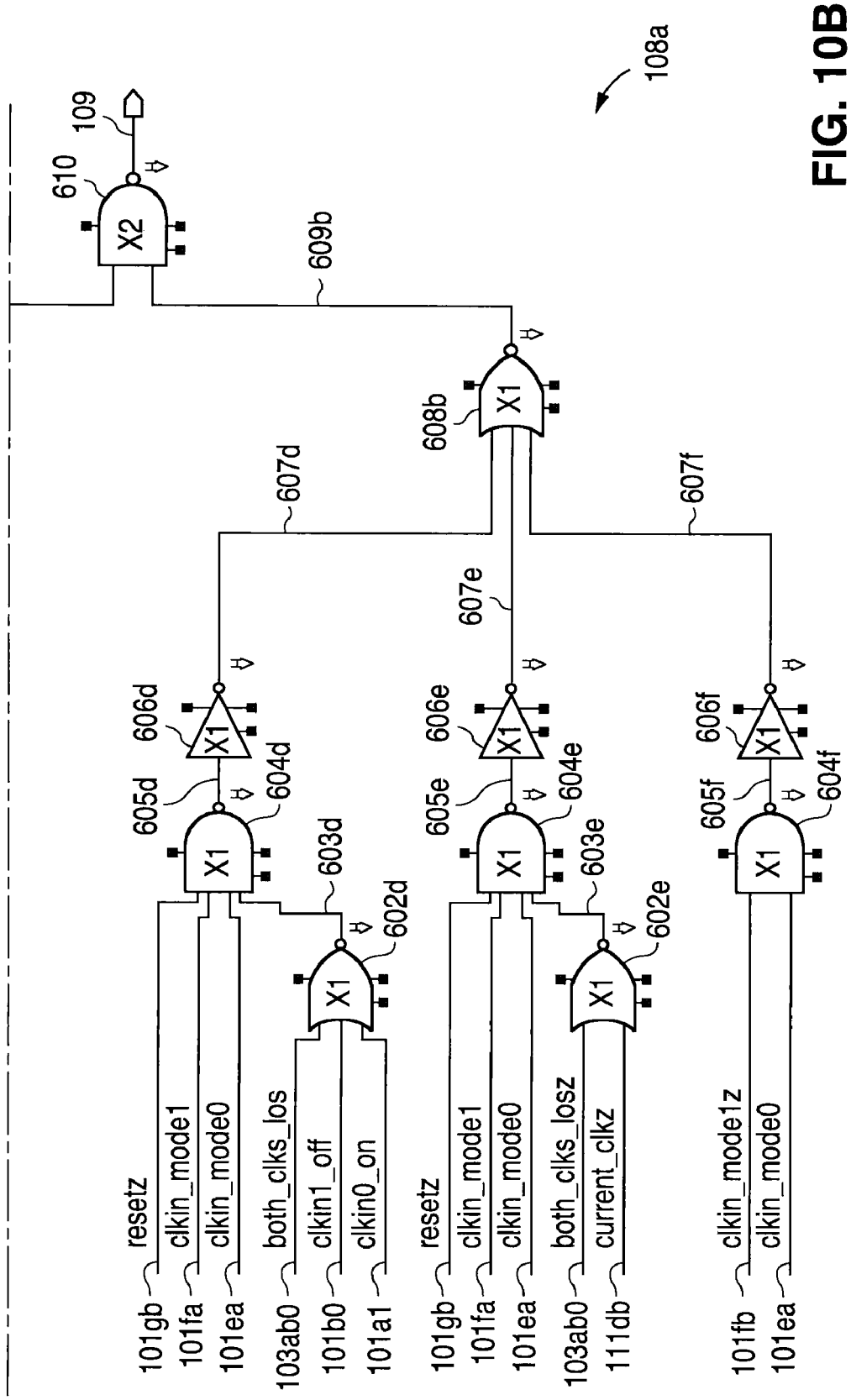
Figure 11A:
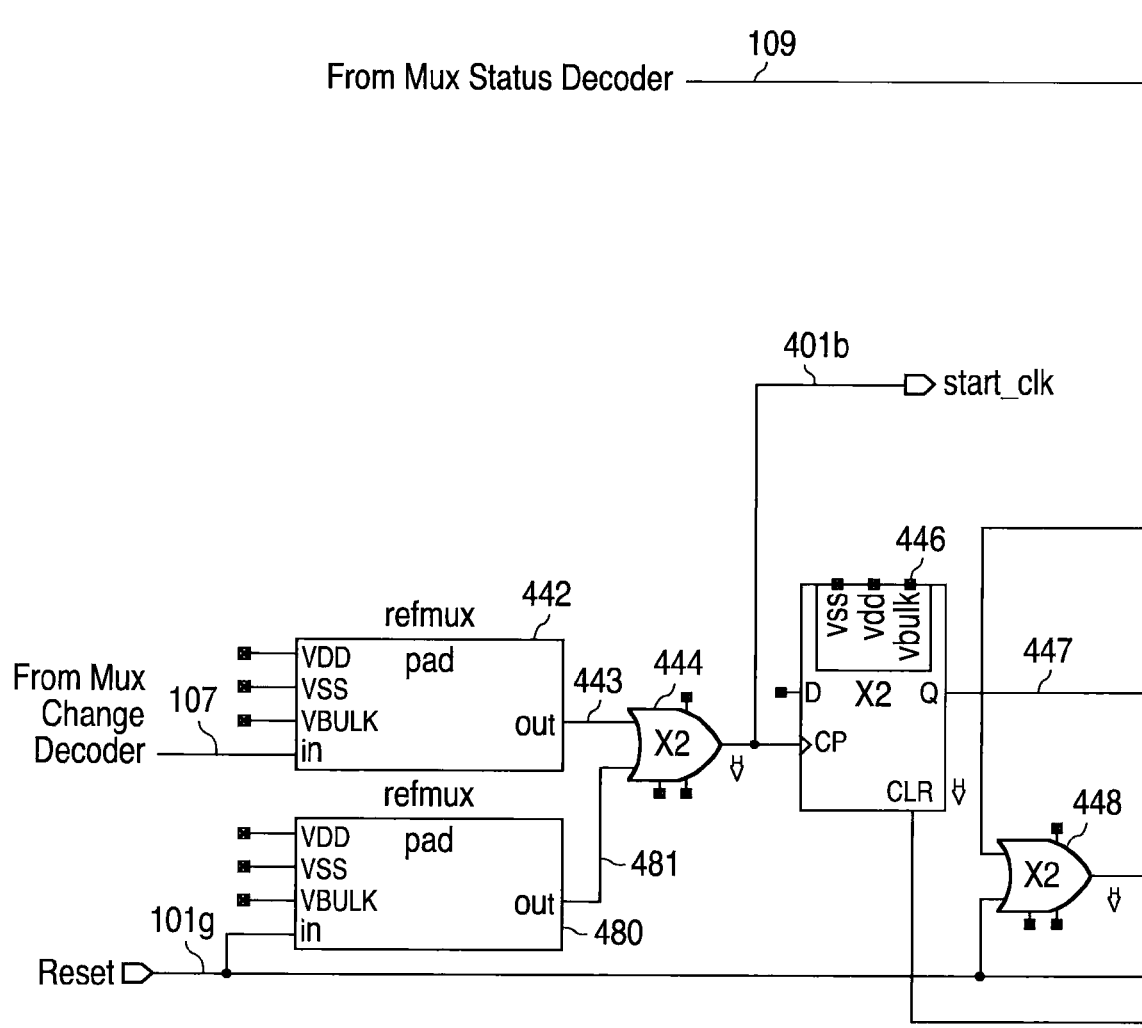
FIG. 11 is a logic diagram of an exemplary embodiment of the sequencer portion of the sequencer stage of FIG. 2.
Figure 11A:
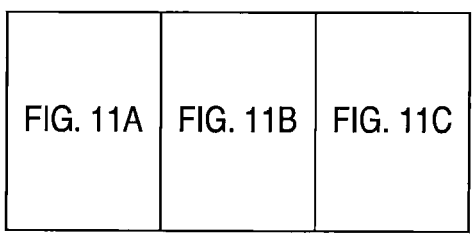
Figure 11B:
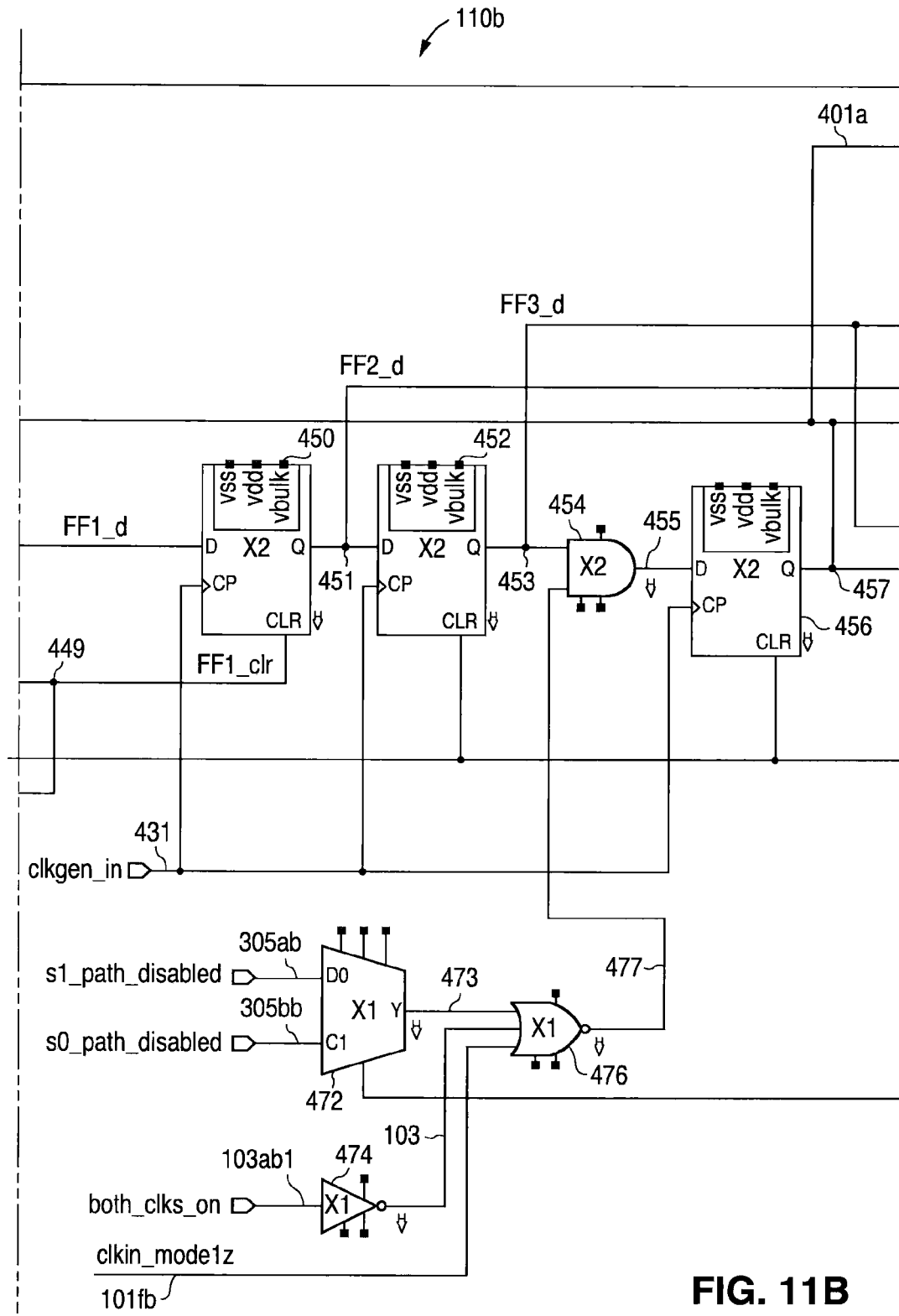
Figure 11C:
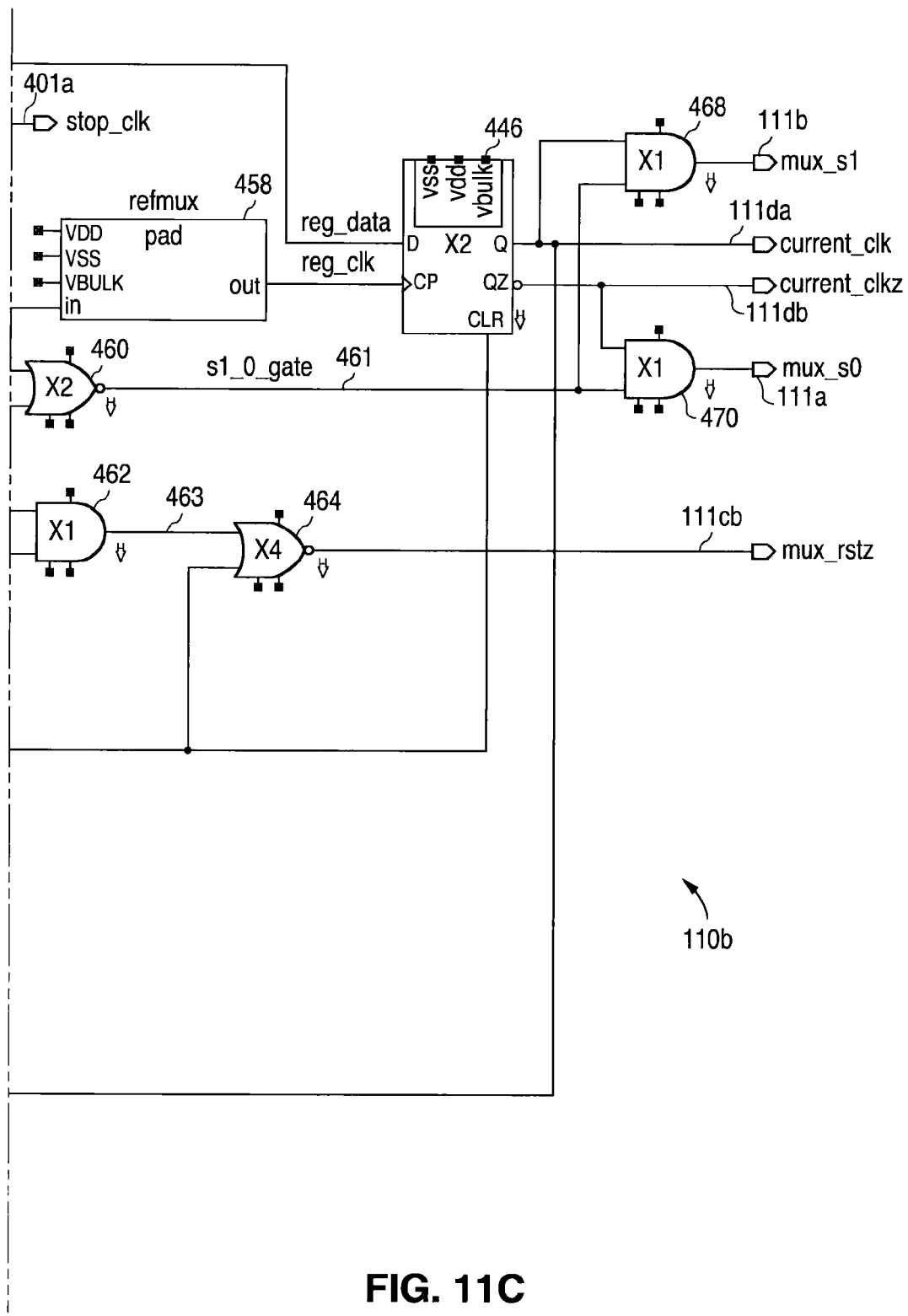

Referring to FIG. 10, one example embodiment 108a of the status decoder 108 (FIG. 2) can be implemented with logic NOR gates 602a, 602b, 602c, 602d, 602e, logic NAND gates 604a, 604b, 604c, 604d, 604e, 604f, logic inverters 606a, 606b, 606c, 606d, 606e, 606f, additional logic NOR gates 608a, 608b, and another logic NAND gate 610, all interconnected substantially as shown. The input signals (at the left side of this figure) correspond to the input signals of the circuit 106a of the FIG. 9.

Referring to FIG. 11, one example embodiment 110b of the sequencer portion of the sequencer and RC oscillator stage 110 (FIG. 2) can be implemented with positive edge detectors 442, 458, a negative edge detector 480, logic OR gates 444, 448, 476, D-type-flip-flops 446, 450, 452, 456, 466, logic AND gates 454, 462, 468, 470, logic NOR gates 460, 464, a logic inverter 474, and a 2:1 multiplexor 472, all interconnected substantially as shown. Similar numeric designators for the various signals have been used, where applicable, to identify correspondence with signals appearing elsewhere in the other figures.

Referring to FIGS. 12A-12B, this truth table, similar to the truth table of FIG. 1, identifies the various signal states; however, a multiplexor in accordance with another embodiment of the presently claimed invention, in accordance with this truth table, has six modes of operation. The first four modes are identical to those discussed above. The two additional modes (modes 4 and 5) are similar to modes 2 and 3, but with the roles of the two input clocks (clock 0 and clock 1) reversed with respect to the non-revertive and revertive states.

Figure 13:
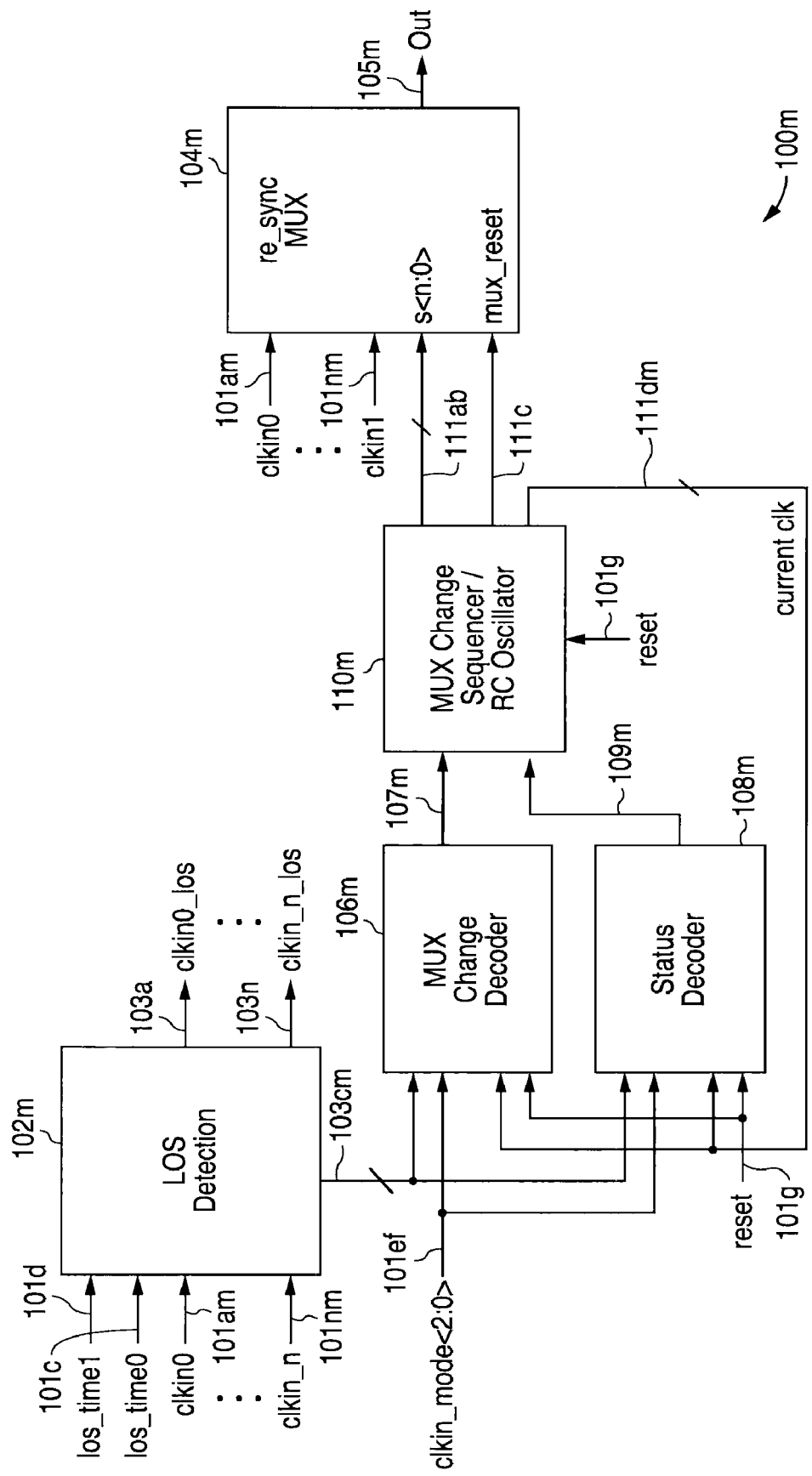
FIG. 13 is a functional block diagram of a digital signal multiplexor for operation in accordance with the truth table of FIGS. 12A-12B.

Referring to FIG. 13, an alternative embodiment 100m of a multiplexor in accordance with the presently claimed invention corresponding to the truth table of FIGS. 12A-12B includes a loss-of-signal detection stage 102m, a re-sync multiplexor 104m, a change decoder 106m, a status decoder 108m, and a sequencer/oscillator 110m, similar to the circuit 100 of FIG. 2. However, in this embodiment 100m, multiple input clock signals 101 am, . . . , 101 nm are available for selection as the output clock signal 105m, in accordance with the foregoing discussion.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

What is claimed is:

1. An apparatus including a digital multiplexer for selecting among a plurality of input clock signals to provide an output clock signal substantially free of spurious signals related to said selecting among said plurality of input clock signals, comprising:

signal loss detection circuitry responsive to a plurality of input clock signals by providing a plurality of signal loss status signals and a plurality of system control signals, wherein each one of said plurality of input clock signals includes respective active and inactive signal states, and respective pulse durations during said active signal states;

decoding circuitry coupled to said signal loss detection circuitry and responsive to said plurality of system control signals and a plurality of clock mode control signals by providing a plurality of clock state signals and an output reset signal; and synchronized multiplexer circuitry coupled to said decoding circuitry and responsive to said plurality of input clock signals, said plurality of clock state signals and said output reset signal by selecting one of said plurality of input clock signals as an output clock signal having a minimum pulse duration at least as long as one of said respective pulse durations of said plurality of input clock signals, wherein a first one of said plurality of input clock signals is initially selected as said output clock signal, following a transition by said first one of said plurality of input clock signals from said active state to said inactive state, said first one of said plurality of input clock signals is deselected as said output clock signal, following said deselection of said first one of said plurality of input clock signals as said output clock signal, said output clock signal is reset to a predetermined state, and following said resetting of said output clock signal to said predetermined state, a second one of said plurality of input clock signals is selected as said output clock signal.

2. The apparatus of claim 1, wherein:

said signal loss detection circuitry is further responsive to a plurality of timing control signals by providing said plurality of signal loss status signals and said plurality of system control signals; and said selected one of said plurality of input clock signals is further selected in accordance with said plurality of timing control signals.

3. The apparatus of claim 1, wherein, responsive to said plurality of clock mode control signals and said respective active and inactive signal states of said plurality of input clock signals:

following a transition by said first one of said plurality of input clock signals from said inactive state to said active state, said second one of said plurality of input clock signals is deselected as said output clock signal;

following said deselection of said second one of said plurality of input clock signals as said output clock signal, said output clock signal is reset to said predetermined state; and following said resetting of said output clock signal to said predetermined state, said first one of said plurality of input clock signals is selected as said output clock signal.

4. The apparatus of claim 1, wherein, responsive to said plurality of clock mode control signals and said respective active and inactive signal states of said plurality of input clock signals:

following a transition by said first one of said plurality of input clock signals from said inactive state to said active state, said second one of said plurality of input clock signals remains selected as said output clock signal;

following a transition by said second one of said plurality of input clock signals from said active state to said inactive state, said second one of said plurality of input clock signals is deselected as said output clock signal;

following said deselection of said second one of said plurality of input clock signals as said output clock signal, said output clock signal is reset to said predetermined state; and following said resetting of said output clock signal to said predetermined state, said first one of said plurality of input clock signals is selected as said output clock signal.

5. The apparatus of claim 1, wherein said decoding circuitry comprises: signal change decoding circuitry responsive to said plurality of system control signals, said plurality of clock mode control signals and a feedback signal by providing a clock change control signal; signal status decoding circuitry responsive to said plurality of system control signals, said plurality of clock mode control signals and said feedback signal by providing a clock change status signal; and signal source and sequencing circuitry coupled to said signal change decoding circuitry and said signal status decoding circuitry, and responsive to said clock change control signal and said clock change status signal by providing said plurality of clock state signals, said output reset signal and said feedback signal.

6. An apparatus including a digital multiplexor for selecting among a plurality of input clock signals to provide an output clock signal substantially free of spurious signals related to said selecting among said plurality of input clock signals, comprising:

detector means for receiving a plurality of input clock signals including first and second clock signals having, when active, first and second clock pulse durations, respectively, and in response thereto providing a plurality of decoder control signals;

decoder means for receiving a plurality of selection control signals and said plurality of decoder control signals, and in response thereto providing a plurality of multiplex control signals;

multiplexor means for receiving said plurality of input clock signals and said plurality of multiplex control signals, and in response thereto during a first selection time interval, selecting said first clock signal for use as an output signal, during a first intervening time interval following said plurality of multiplex control signals becoming indicative of a detection of said first clock signal having become inactive, deselecting said first clock signal for use as said output signal, during said first intervening time interval, resetting said output signal to a predetermined state unrelated to said first and second clock signals, and following said resetting of said output signal to a predetermined state, during a second selection time interval, selecting said second clock signal for use as said output signal, wherein said output signal has a minimum pulse duration at least as long as one of said first and second clock pulse durations during said first and second selection time intervals.

7. The apparatus of claim 6, wherein said multiplexor means is further for resetting said output signal to said predetermined state following said deselecting of said first clock signal for use as said output signal.

8. The apparatus of claim 6, said multiplexor means is further for receiving said plurality of input clock signals and said plurality of multiplex control signals, and in response thereto:

during a second intervening time interval following said selecting of said second clock signal for use as said output signal and following said plurality of multiplex control signals becoming indicative of a detection of said first clock signal having become active, deselecting said second clock signal for use as said output signal;

during said second intervening time interval, resetting said output signal to said predetermined state; and following said resetting of said output signal to said predetermined state, during a third selection time interval, selecting said first clock signal for use as said output signal.

9. The apparatus of claim 8, wherein said output signal has a minimum pulse duration at least as long as one of said first and second clock pulse durations during said third selection time interval.

10. The apparatus of claim 8, wherein said multiplexor means is further for resetting said output signal to said predetermined state following said deselecting of said second clock signal for use as said output signal.

11. The apparatus of claim 6, wherein said multiplexor means is further for receiving said plurality of input clock signals and said plurality of multiplex control signals, and in response thereto:
following said selecting of said second clock signal for use as said output signal and said plurality of multiplex control signals becoming indicative of a detection of said first clock signal having become active, continuing said selection of said second clock signal as said output signal; and
following said plurality of multiplex control signals becoming indicative of a detection of said second clock signal having become inactive
during a second intervening time interval, deselecting said second clock signal for use as said output signal,
during said second intervening time interval, resetting said output signal to said predetermined state, and
following said resetting of said output signal to said predetermined state, during a third selection time interval, selecting said first clock signal for use as said output signal.

12. The apparatus of claim 11, wherein said output signal has a minimum pulse duration at least as long as one of said first and second clock pulse durations during said third selection time interval.

13. The apparatus of claim 11, wherein said multiplexor means is further for resetting said output signal to said predetermined state following said deselecting of said second clock signal for use as said output signal.

14. The apparatus of claim 6, wherein:
said detector means is further for receiving a plurality of timing control signals and said plurality of input clock signals, and in response thereto providing said plurality of decoder control signals; and
said first and second selection time intervals are related to said plurality of timing control signals.

15. A method for selecting among a plurality of input clock signals to provide an output clock signal substantially free of spurious signals related to said selecting among said plurality of input clock signals, comprising:
receiving a plurality of input clock signals including first and second clock signals having, when active, first and second clock pulse durations, respectively;
receiving a plurality of selection control signals and in response thereto, during a first selection time interval, selecting said first clock signal for use as an output signal;
detecting when said first clock signal becomes inactive and in response thereto, during a first intervening time interval, deselecting said first clock signal for use as said output signal;
during said first intervening time interval, resetting said output signal to a predetermined state unrelated to said first and second clock signals; and
following said resetting of said output signal to a predetermined state, during a second selection time interval, selecting said second clock signal for use as said output signal, wherein said output signal has a minimum pulse duration at least as long as one of said first and second clock pulse durations during said first and second selection time intervals.

16. The method of claim 15, wherein said resetting said output signal to a predetermined state unrelated to said first and second clock signals comprises resetting said output signal to said predetermined state following said deselecting of said first clock signal for use as said output signal.

17. The method of claim 15, further comprising:
following said selecting of said second clock signal for use as said output signal, detecting when said first clock signal becomes active and in response thereto, during a second intervening time interval, deselecting said second clock signal for use as said output signal;
during said second intervening time interval, resetting said output signal to said predetermined state; and
following said resetting of said output signal to said predetermined state, during a third selection time interval, selecting said first clock signal for use as said output signal.

18. The method of claim 17, wherein said output signal has a minimum pulse duration at least as long as one of said first and second clock pulse durations during said third selection time interval.

19. The method of claim 17, wherein said resetting said output signal to a predetermined state unrelated to said first and second clock signals comprises resetting said output signal to said predetermined state following said deselecting of said second clock signal for use as said output signal.

20. The method of claim 15, further comprising, following said selecting of said second clock signal for use as said output signal, detecting when said first clock signal becomes active and in response thereto:
continuing said use of said second clock signal as said output signal; and
detecting when said second clock signal becomes inactive and in response thereto
during a second intervening time interval, deselecting said second clock signal for use as said output signal,
during said second intervening time interval, resetting said output signal to said predetermined state, and
following said resetting of said output signal to said predetermined state, during a third selection time interval, selecting said first clock signal for use as said output signal.

21. The method of claim 20, wherein said output signal has a minimum pulse duration at least as long as one of said first and second clock pulse durations during said third selection time interval.

22. The method of claim 20, wherein said resetting said output signal to a predetermined state unrelated to said first and second clock signals comprises resetting said output signal to said predetermined state following said deselecting of said second clock signal for use as said output signal.

23. The method of claim 15, further comprising receiving a plurality of timing control signals and in response thereto establishing said first and second selection time intervals.

* * * * *